United States Patent [19]

Cunningham

[11] 4,152,665
[45] May 1, 1979

[54] AMPLIFIER LINEARITY COMPENSATION APPARATUS

[75] Inventor: Vernon R. Cunningham, Melissa, Tex.

[73] Assignee: Rockwell International Corporation, El Segundo, Calif.

[21] Appl. No.: 881,499

[22] Filed: Feb. 27, 1978

[51] Int. Cl.² .............................................. H03F 3/26
[52] U.S. Cl. ..................................... 330/263; 330/149; 330/267
[58] Field of Search .......................... 330/149, 263, 267

[56] References Cited

U.S. PATENT DOCUMENTS

| 3,944,944 | 3/1976 | Ellenbecker | 330/149 |
| 4,039,964 | 8/1977 | Ishii | 330/149 |

*Primary Examiner*—Lawrence J. Dahl
*Attorney, Agent, or Firm*—Bruce C. Lutz; Howard R. Greenberg; H. Fredrick Hamann

[57] ABSTRACT

The present invention comprises a circuit for addition to a non-linear amplifier wherein the non-linearity is of the first degree. The circuit essentially adds a signal (or signal variable impedance path) to that already existing to remove non-linearity in operating characteristics over a given range of voltage.

7 Claims, 6 Drawing Figures

AMPLIFIER LINEARITY COMPENSATION APPARATUS

THE INVENTION

The present invention is generally related to electronics and more specifically to an inventive approach for improving the linearity of signal amplification in electronic circuitry. Even more specifically, the invention is related to improving the linearity of FM receiver circuit amplifiers.

Historically the linearity slope of an FM receiver has been adjusted for maximum flatness in the discriminator. Linearity as used herein is defined as the derivative of amplitude with respect to frequency ($dA/d\omega$) for an FM receiver, or the derivative of output amplitude with respect to input amplitude ($dA_o/dA_i$) for an amplifier. This procedure has been usable as long as the accompanying baseband amplifiers have negligible linearity slope or if the linearity slopes of all outputs (if there are more than one) are identical. As linearity slope specifications have increased in severity (decreased in amount of tolerance allowable) two factors have combined to render the earlier procedure progressively less attractive. The first of these is the continuous drive in all receivers toward better intermodulation distortion characteristics. Secondly, in microwave systems, the more recent FM receivers have additionally required that the receivers have two outputs with separate baseband amplifiers.

In an attempt to provide better linearity slope control, a control as described by this invention has been placed in one of the separate baseband amplifiers in addition to the one in the discriminator. Thus, the present invention is applicable to restoring linearity to all types of amplifiers and is not limited to FM receiver systems such as the system in which this device was first used.

Stated in another manner, a portion of the distortion in the prior art has occurred in the electronics subsequent to the discriminator due to non-linearities of the subsequent amplifier. The present invention provides an amplifier which has built-in correction and which compensates not only for the amplifier distortion characteristics but also may apply compensation for the distortion of other electronics prior thereto.

In a preferred embodiment of my invention, an adjustable non-linearity, by means of a diode circuit, is introduced into a circuit. The non-linearity may be adjusted for positive, negative or zero linearity slope. In this way, if first order distortion only (linearity slope) is present at the circuit input, impedance values in the circuit are changing with signal levels such that the signal gain of the electronic unit remains constant over the entire design range of signal levels.

It is therefore an object of the present invention to provide an improved amplifier circuit and/or linearity compensation means.

Other objects and advantages of the present invention will be apparant from a reading of the specification and appended claims in conjunction with the drawings wherein:

DETAILED DESCRIPTION

Figure 1:
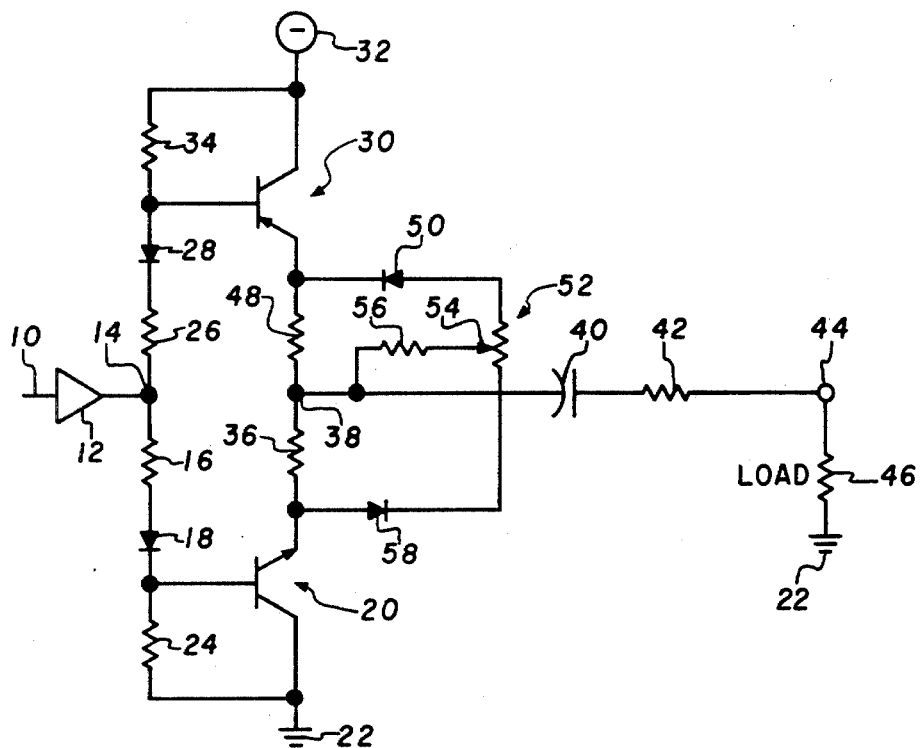
FIG. 1 is a detailed schematic diagram of a preferred embodiment of the inventive concept.

In FIG. 1 an input signal is applied on an input lead 10 to some type of electronic circuit such as an amplifier 12. An output of 12 is applied to a junction point 14 which is connected through a resistor 16 and a diode or temperature compensating means 18 to a base of an NPN transistor or amplifying means generally designated as 20. The collector of transistor 20 is connected to ground or reference potential means 22 and a resistor 24 is connected between the base and collector or transistor 20. Junction point 14 is also connected through a resistor means or impedance means 26 and a diode or temperature compensating means 28 to a base of a PNP transistor or amplifying means generally designated as 30. The collector of transistor 30 is connected to a negative power supply 32. A resistor or impedance means 34 is connected between the base and collector of transistor 30. A resistor or impedance means 36 is connected between the emitter of transistor 20 and a junction point, signal tap or transistor output 38 which is connected through a capacitor or AC signal blocking means 40 and an output impedance or resistor 42 to an output terminal 44. A load 46 is connected between output terminal 44 and ground 22. A further resistor or impedance means 48 is connected between the emitter of transistor 30 and junction point 38. The linearity slope control circuitry is comprised of an A diode or unidirectional signal amplitude variable impedance means also designated as 50, a potentiometer, variable impedance means, or tapped impedance means generally designated as 52 having a wiper 54, a resistor or impedance means 56 and a B or second diode or unidirectional signal amplitude variable impedance means 58. The diode 58, the resistance element of potentiometer 52 and the diode 50 are connected in series between the emitter of transistor 20 and the emitter of transistor 30 as illustrated so that the easy direction of current flow is from transistor 20 to transistor 30. In addition, the resistor 56 is connected between the wiper 54 of potentiometer 52 and junction point 38.

In an attempt to even further teach one skilled in the art the inventive concept it may be noted that in one implementation of the preferred embodiment, the two resistors 36 and 48 are 27 ohms, the two diodes 50 and 58 are 1N4454's, the potentiometer 52 has an impedance of 50 ohms and the resistor 56 has an impedance of 24 ohms. The transistor 20 is a 2N2219A while the transistor 30 is a 2N2907A. The two diodes and the four resistors on the left side of the transistors comprise a biasing and temperature compensating circuit and is believed standard in the art and is not pertinent to the inventive concept. The capacitor 40 and the resistor 42 are 100 microfarads and 68.1 ohms respectively and are used in combination with the previously mentioned components to provide an impedance looking back into terminal 44 of approximately 75 ohms. As designed, this impedance remains substantially constant over the entire range of operation.

Figure 2:
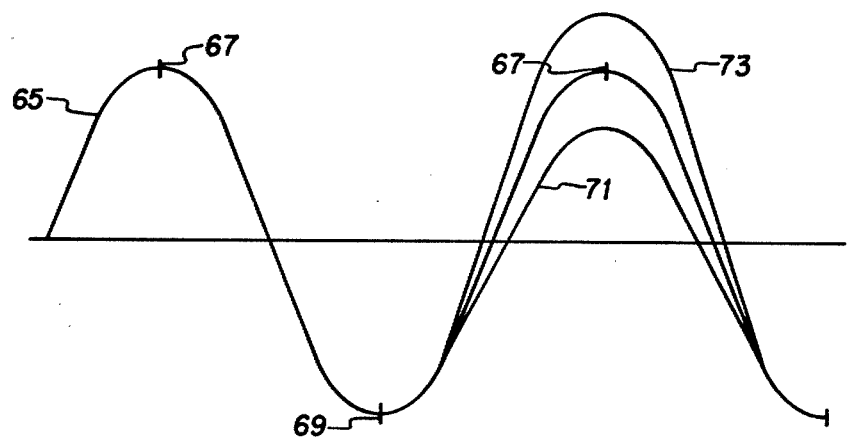
FIG. 2 is a waveform illustrating the change in gain in a signal and the compensating signal utilized to correct for the distortion obtained by non-linearity.

In FIG. 2 an idealized sine waveform 65 is illustrated which has a given positive peak potential 67 and a given negative peak potential 69. A second waveform which illustrates a distortion referred to as an A type distortion is provided a designation of 71. The correction signal is illustrated as 73. The amounts of distortion are greatly exaggerated for purposes of clarity and would normally range more in the order of 1% rather than the approximately 30% illustrated. It will also be noted that both of these curves 71 and 73 are referenced with respect to the negative point 69 of curve 65 for convenience in discussing the operation infra. It may also be noted that normally the distortion introduced by non-linear gain characteristics are continuous in their effect and thus reference at one of the signal extremes is apropos.

Figure 3:
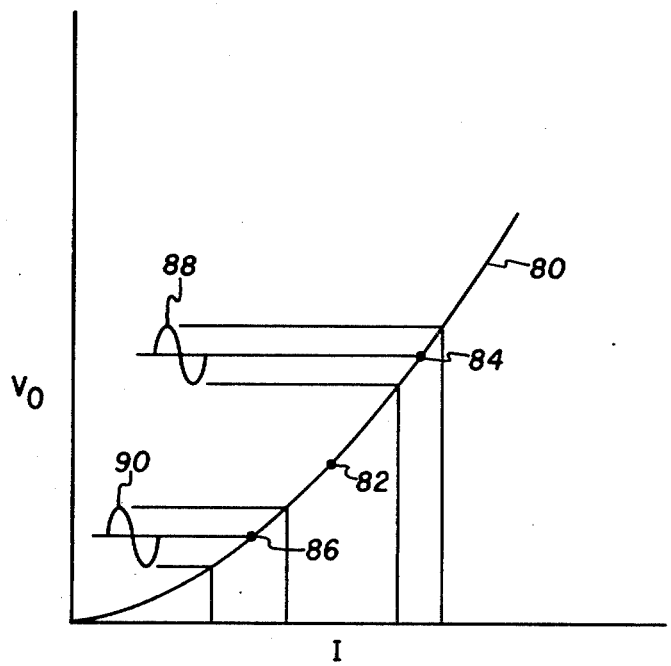
FIG. 3 is a graph illustrating the current-voltage characteristics of a diode in the forward direction and is used in explaining the operation of FIG. 1.

In FIG. 3 a curve designated as 80 is plotted with the vertical axis being voltage across a diode and the horizontal axis being the current through a diode. A point 82 on the graph illustrates the normal operating characteristics of diodes 50 and 58 if the wiper 54 is centered on potentiometer 52. The points 84 and 86 are illustrative examples of the points of operation of the diodes 50 and 58 when the wiper 54 is offset from the middle point in a compensating mode. The two signal waveforms 88 and 90 are used in the discussion of operation to illustrate the movement or change in impedance of the diode due to the effect of a changing voltage level thereacross caused by the change in signal level being applied to the circuit at input 10 of FIG. 1.

Figure 4:
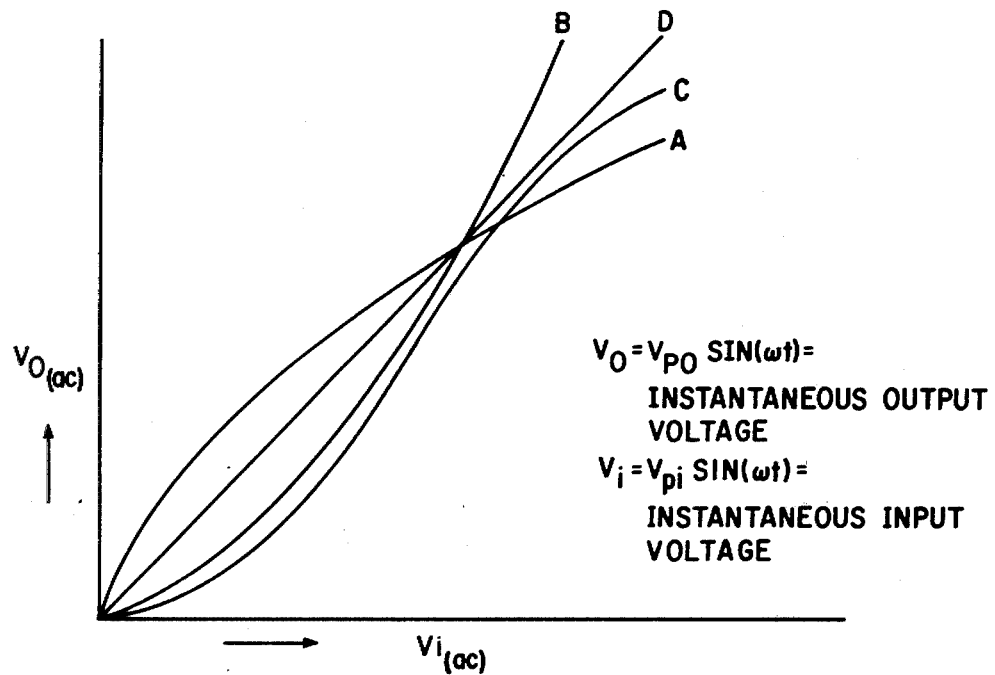
FIG. 4 is a graph illustrating transfer characteristics of electronic circuits to be compensated and the transfer characteristic of the compensation circuit and is again used in explaining the operation of FIG. 1.

In FIG. 4 four transfer characteristics are illustrated with voltage IN illustrated on the horzontal axis and voltage OUT illustrated on the vertical axis. In both instances these are instant means AC voltage, not DC voltage. The curves are labeled A, B, C and D. Curve D illustrates a linear transfer function while curves A and B illustrate transfer functions where the gain is changing continually in the same direction and is thus a first order function. Curve C illustrates a second order transfer characteristic. Compensation for this type of second order transfer characteristic is not provided for directly in this inventive concept.

Figure 5:
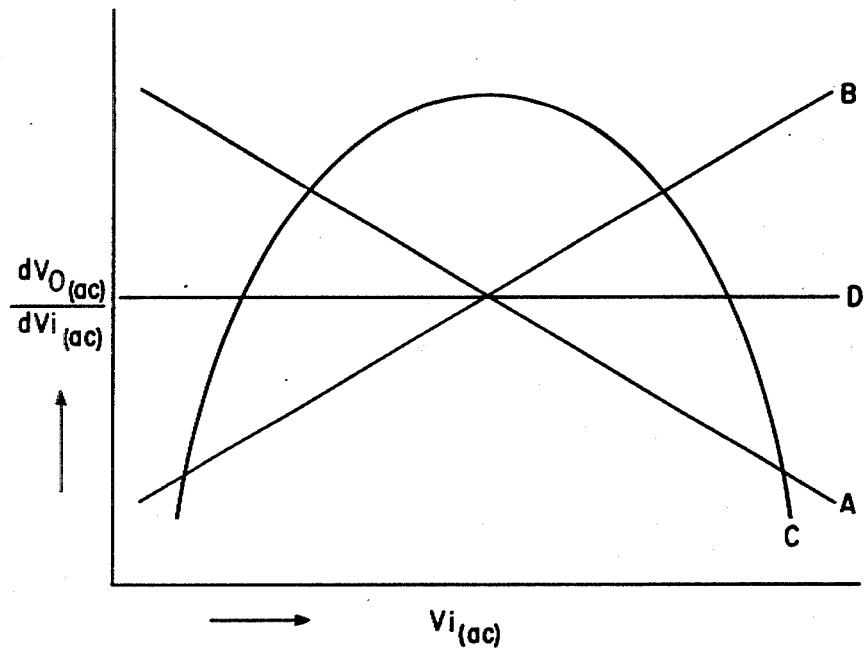
FIG. 5 is a graph illustrating various linearity characteristics.

In FIG. 5 a linearity characteristic is illustrated with the change in AC output voltage to change in AC input voltage (dVo/dVi) used as the vertical axis and the input voltage used as the horizontal axis. It will be noted that the linearity characteristics for corresponding curves are provided the same designations as used in conjunction with FIG. 4. As indicated above, the present invention is able to provide linearity compensation for the straight line curves of A and B but not for the parabolic linearity distortion illustrated by curve C. When the compensation is provided, the linearity characteristic of the composite circuit is flat as shown in D. In other words, over the entire range of input voltages the gain (output voltage/input voltage) remains constant.

Figure 6:
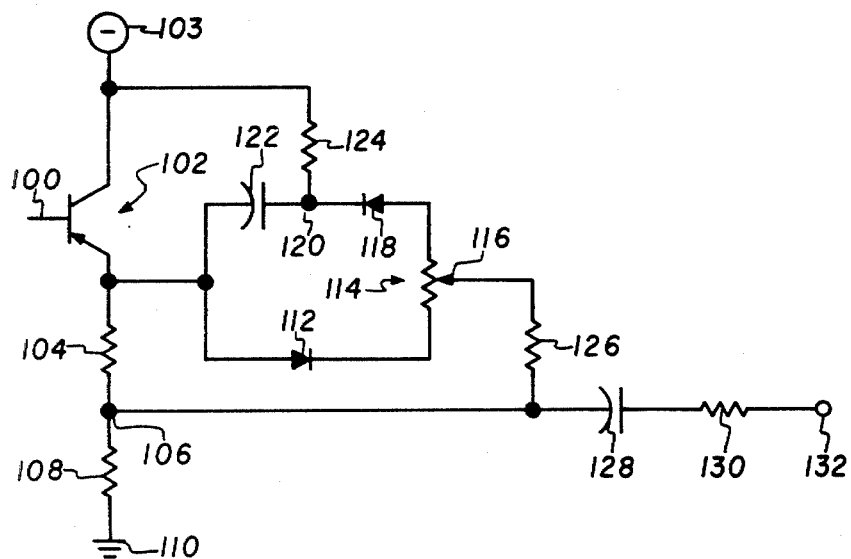
FIG. 6 is a schematic diagram of an alternate embodiment of the inventive concept.

In FIG. 6 an input signal similar to that of 14 in FIG. 1 is applied on lead 100 to a base of a PNP transistor or amplifying means generally designated as 102 having a collector connected to a minus potential 103 and the emitter connected through a first resistor 104, a junction point 106 and a second resistor 108 to ground 110. The emitter of transistor 102 is also connected to an anode of a diode 112 whose cathode is connected to one end of a potentiometer or variable impedance means generally designated as 114 having a wiper 116. The other end of the resistance element of potentiometer 114 is connected to an anode of a diode 118 whose other end is connected to a junction point 120. A capacitor 122 is connected between junction point 120 and the emitter of transistor 102. A biasing resistor 124 is connected between junction point 120 and the minus potential 103. A resistor 126 is connected between wiper 116 and junction point 106. A capacitor 128 and a resistor 130 are connected between junction point 106 and output terminal 132 in a manner similar to that mentioned for components 40 and 42 in FIG. 1.

OPERATION

It may be assumed for the purpose of discussion that the signal gain from input 10 to output terminal 44 of FIG. 1 is exactly 1. Thus, sine wave curve 65 can represent not only the input signal but the idealized output signal.

Waveform 65 is merely the idealized output signal and represents the signal which would be obtained if all the electronics in amplifier 12 were such that it had a flat linearity characteristic. It may be assumed however, that it has a transfer characteristic such as illustrated by line A in FIG. 4. With this type of characteristic the change in voltage at the output for an incremental change in input voltage decreases as the input voltage increases. This is illustrated by the line A in FIG. 5 and illustrates that the output waveform 71 would not reach the idealized maximum potential 67 as illustrated in FIG. 2. The compensating circuitry thus adds the difference between waveform 65 and waveform 73 by means of a transfer characteristic such as illustrated as line B in FIG. 4 or by the linearity characteristic line B in FIG. 5 to obtain the idealized waveform 65 of FIG. 2 at output 44 and the characteristics D of FIGS. 4 and 5.

It will be realized that if the wiper 54 of FIG. 1 is centered on the resistance element of potentiometer 52, there will be equal current flow through both diodes 50 and 58 and thus there is zero effect on the transfer characteristics of the prior circuitry. In other words, the output signal obtained at junction point 38 is identical with the waveform obtained at junction 14. Since the circuitry uses the emitter follower configuration, there is no voltage gain through the transistors 20 and 30 and the waveform at the emitters thereof have the same phase as the input signal applied to junction 14 and thus to the bases of the two transistors. Since both emitters move in the positive voltage direction simultaneously in accordance with an alternating input signal, there is no change in current through the two diodes 50 and 58 with the wiper 54 centered on the resistance element of potentiometer 52. This center point is illustrated in FIG. 3 as point 82. However, as the wiper 54 is altered from center, the relative current levels in the two diodes are altered in the opposite direction. Not only does this alteration change the DC current levels through these two diodes (base operating points), these current levels are modulated by (change in accordance with) the alternating signals obtained from the emitters of the two transistors. This occurs because the impedance between the respective emitters and the junction point 38 is altered. As can be observed from FIG. 3, the change of the wiper 54 to an extreme end of potentiometer 52 will cause one of the diodes to vary on curve 80 in accordance with the peak amplitude of signal 88. The other diode will vary on curve 80 around point 86 in accordance with the peak amplitudes of signal 90. As will be observed, this curve 80 is not linear and thus the voltage change for a given current change is not the same over the range of the associated signals 88 and 90. Another way of stating this is that the resistance changes with signal level changes. In accordance with this observation it will be apparent that the gain between junction point 14 and output 38 varies as a function of signal level due to the changing impedance on the emitters of transistors 20 and 30. Thus, depending upon the direction of movement of wiper 54 with respect to the center position, a compensation in transfer characteristics of either A or B can be provided to compensate for the complementary non-linearity characteristic in the previous electronics of amplifier 12. This alteration in impedance as a function of signal level corrects for non-linearities in the output signal and in one embodiment was able to compensate for a circuit having as much as 2% non-linearity to an output signal which had a linearity within 0.1% over the same signal amplitude range.

As a matter of interest and further teaching, it may be noted that one embodiment of the invention used a minus 18 volts for supply 32 and that the biasing was such that the emitters of transistors 20 and 30 were approximately minus 9 and minus 11 volts respectively.

FIG. 6 operates substantially the same as FIG. 1 and is provided to illustrate that the compensation technique can be used equally well with a single amplifying device such as transistor 102 as with the complementary symmetry transistors 20 and 30 of FIG. 1. In this circuit the signal is applied to base lead 100 and output on the emitter of 102 as well as at junction point 106. The adjustment of wiper 116 causes the load on the emitter of transistor 102 to vary in accordance with either the A or B characteristic of FIG. 4 so as to compensate for the complementary transfer characteristic of the circuitry prior to lead 100 that is causing the distortion. Thus, a controlled non-linearity in AC load impedance is introduced to the emitter of transistor 102 whereby the output signal on terminal 132 is modified in a manner to create a total linearity characteristic within design specifications. The capacitor 122 is installed to assure that the proper biasing of diodes 112 and 118 will occur.

While two embodiments of the inventive concept have been described, and while the total theory behind the operation of this circuit is not completely understood, the best understanding to-date has been provided herein. Although two embodiments have been illustrated, it is believed that the principles taught by this concept include many other configurations of standard engineering design and I thus wish to be limited not by the embodiments shown but only by the scope of the appended material claimed.

I claim:

1. Apparatus for use with amplifying means having push-pull stages and an first impedance connected therebetween for supplying a single signal from a signal tap on said impedance means to improve the slope linearity of said amplifying means comprising, in combination:

first and second diode means each including first and second terminal means;

second impedance means including first, second and third terminal means;

means connecting said second and third terminal means of said second impedance means between said second terminal means of said first and second diode means;

means for connecting the first terminal means of said first diode means to one of a pair of push-pull stages of an amplifying means;

means for connecting the first terminal means of said second diode means to the other of a pair of push-pull stages of an amplifying means; and means for connecting the first terminal means of said second impedance means to the signal tap of the amplifying means.

2. Amplifying apparatus comprising, in combination:

first transistor means of a first polarity type including base means, collector means and emitter means;

second transistor means, complementary in type to said first transistor means, including base means, collector means and emitter means;

tapped first resistor means connected between said emitter means of said first and second transistor means;

power supply means connected across said collectors of said first and second transistor means;

signal supplying means connected to said base means of each of said first and second transistor means for supplying signals thereto;

first diode means connected at one end to said emitter means of said first transistor means;

second diode means connected at one end to said emitter means of said second transistor means;

tapped second resistor means connected between the other ends of said first and second diode means;

third resistor means connected between the taps of said first and second resistor means; and signal output means connected to the tap of said first resistor means.

3. Amplifying apparatus comprising, in combination:

first signal amplifying means of a given type including signal input means and first and second power terminal means;

second signal amplifying means, complementary in type to said first amplifying means, including signal input means and first and second power terminal means;

first tapped impedance means connected between said first power terminal means of said first and second amplifying means;

power supply means connected across said second terminal means of said first and second amplifying means;

signal supplying means connected to said signal input means of each of said first and second amplifying means for supplying signals thereto;

first unidirectional current means including first and second ends, connected at the first end thereof to said first power terminal means of said first amplifying means;

second unidirectional current means including first and second ends, connected at the first end thereof to said first power terminal means of said second amplifying means;

tapped second impedance means connected between the second ends of each of said first and second unidirectional current means, said second impedance means including tap means;

third impedance means connected between the tap of said first impedance means and said tap of said second impedance means; and signal output means connected to the tap of said first impedance means for supplying output signals adjusted for improved linearity as compared with the signal supplied by said signal supplying means.

4. The method of compensating for predeterminable changes in gain of a signal with changes in signal amplitude through signal processing means comprising the steps of:
generating a compensating signal whose changes in gain with signal amplitude are complementary to the signal obtained from the signal processing means; and
adding the compensating signal to the signal obtained from the signal processing means to obtain a resultant having a substantially linear gain characteristic.

5. Apparatus for compensating for non-linear gain characteristics in a received signal comprising, in combination:
first means for supplying a non-linear gain characteristic first signal having a first gain linearity slope;
second means for generating a compensating second signal having a second gain linearity slope complementary said first slope; and
summing means, connected to said first means and said second means, for combining said first and second signals to obtain a resultant signal having a substantially flat linearity slope characteristic.

6. The method of compensating for changes in gain of a signal with signal amplitude comprising the steps of:
providing an isolation circuit whose output voltage is sensitive to and varies directly with load impedance levels; and
altering the load impedance in a complementary manner in accordance with signal level whereby prior stage signal non-linearities are minimized.

7. Apparatus for compensating for non-linear gain characteristics in a received signal by minimizing the linearity slope of the signal comprising, in combination:
first means for supplying a non-linear gain characteristic first signal having a first gain linearity slope;
second means, connected to said first means for receiving said first signal therefrom, for providing an output signal whose amplitude is sensitive to load impedance levels and thus in gain from input to output thereof; and
third means, connected to said second means for variably loading said second means in accordance with signal amplitudes to provide an output signal at said output of said second means which has a more nearly level linearity slope characteristic than said first signal.

* * * * *